US011689317B2

(12) United States Patent
Huang et al.

(10) Patent No.: US 11,689,317 B2
(45) Date of Patent: Jun. 27, 2023

(54) RE-TRANSMISSION CRC FOR POLAR CODING INCREMENTAL-REDUNDANCY HARQ

(71) Applicant: MediaTek Inc., Hsinchu (TW)

(72) Inventors: Tun-Ping Huang, Hsinchu (TW); Mao-Ching Chiu, Hsinchu (TW); Wei-De Wu, Hsinchu (TW); Chia-Wei Tai, Hsinchu (TW); Tien-Yu Lin, Hsinchu (TW); Tao Chen, Beijing (CN)

(73) Assignee: MediaTek Inc.

( * ) Notice: Subject to any disclaimer, the term of this patent is extended or adjusted under 35 U.S.C. 154(b) by 9 days.

(21) Appl. No.: 17/368,575

(22) Filed: Jul. 6, 2021

(65) Prior Publication Data

US 2022/0014308 A1    Jan. 13, 2022

Related U.S. Application Data

(60) Provisional application No. 63/058,581, filed on Jul. 30, 2020, provisional application No. 63/051,091, filed on Jul. 13, 2020.

(30) Foreign Application Priority Data

Jul. 2, 2021    (CN) .......................... 202110750189.6

(51) Int. Cl.
*H03M 13/00* (2006.01)
*H04L 1/00* (2006.01)
*H03M 13/13* (2006.01)
*H04L 1/1607* (2023.01)
*H04L 1/1812* (2023.01)

(52) U.S. Cl.
CPC .......... *H04L 1/0061* (2013.01); *H03M 13/13* (2013.01); *H04L 1/1614* (2013.01); *H04L 1/1812* (2013.01)

(58) Field of Classification Search
CPC ... H04L 1/0061; H04L 1/1614; H04L 1/1812; H03M 13/13
See application file for complete search history.

(56) References Cited

U.S. PATENT DOCUMENTS 10,375,681 B2 * 8/2019 Papasakellariou .... H04L 5/0055
10,469,207 B2 * 11/2019 Shen ..................... H04L 1/1819
(Continued)

FOREIGN PATENT DOCUMENTS

CN    109196801 A    1/2019

OTHER PUBLICATIONS

Taiwan Intellectual Property Office, Office Action for Taiwan Patent Application No. 110125054, dated Dec. 16, 2022.

*Primary Examiner* — Esaw T Abraham
(74) *Attorney, Agent, or Firm* — Han IP PLLC; Andy M. Han

(57) ABSTRACT

Examples pertaining to re-transmission cyclic redundancy check (CRC) for polar coding incremental-redundancy hybrid automatic repeat request (IR-HARQ) are described. An apparatus (e.g., UE) encodes a plurality of information bits using a polar code to generate a polar code block (CB). The apparatus performs one or more transmissions of the polar CB using hybrid automatic repeat request (HARQ) by performing an initial transmission of the polar CB and performing a re-transmission of the polar CB with a re-transmission cyclic redundancy check (ReTX CRC).

12 Claims, 5 Drawing Sheets

(56) References Cited

U.S. PATENT DOCUMENTS

| | | | |
|---|---|---|---|
| 10,574,401 B2* | 2/2020 | Li | H04L 1/1819 |
| 10,721,029 B2* | 7/2020 | Xu | H03M 13/6306 |
| 10,790,934 B2* | 9/2020 | Ye | H04L 1/1867 |
| 10,833,811 B2* | 11/2020 | Cao | H04L 1/0041 |
| 10,903,857 B2* | 1/2021 | Noh | H04L 1/0041 |
| 10,932,241 B2* | 2/2021 | Kwak | H04W 72/0413 |
| 10,944,517 B2* | 3/2021 | Li | H04L 1/1819 |
| 11,057,053 B2* | 7/2021 | Gross | H03M 13/6362 |
| 11,362,769 B2* | 6/2022 | Xu | H04L 1/1819 |
| 2019/0052418 A1 | 2/2019 | Li et al. | |
| 2019/0356420 A1 | 11/2019 | John Wilson et al. | |
| 2020/0067532 A1 | 2/2020 | Zhang et al. | |

* cited by examiner

400

```
┌─────────────────────────────────────────────┐
│ ENCODE, BY A PROCESSOR OF AN APPARATUS, A   │
│ PLURALITY OF INFORMATION BITS USING A POLAR │
│ CODE TO GENERATE A POLAR CODE BLOCK (CB)    │
│                    410                      │
└─────────────────────────────────────────────┘
                      │
                      ▼
┌─────────────────────────────────────────────┐
│ PERFORM, BY THE PROCESSOR, ONE OR MORE      │
│ TRANSMISSIONS OF THE POLAR CB USING HYBRID  │
│ AUTOMATIC REPEAT REQUEST (HARQ)             │
│                    420                      │
│                                             │
│   ┌─────────────────────────────────────┐   │
│   │ PERFORM AN INITIAL TRANSMISSION OF  │   │
│   │          THE POLAR CB               │   │
│   │                422                  │   │
│   └─────────────────────────────────────┘   │
│                    │                        │
│                    ▼                        │
│   ┌─────────────────────────────────────┐   │
│   │ PERFORM A RE-TRANSMISSION OF THE    │   │
│   │ POLAR CB WITH A RE-TRANSMISSION     │   │
│   │ CYCLIC REDUNDANCY CHECK (ReTX CRC)  │   │
│   │                424                  │   │
│   └─────────────────────────────────────┘   │
└─────────────────────────────────────────────┘
```

FIG. 4

RE-TRANSMISSION CRC FOR POLAR CODING INCREMENTAL-REDUNDANCY HARQ

CROSS REFERENCE TO RELATED PATENT APPLICATION(S)

The present disclosure is part of a non-provisional application claiming the priority benefit of U.S. Patent Application No. 63/051,091 and 63/058,581, filed on 13 Jul. 2020 and 30 Jul. 2020, respectively, as well as China Patent Application No. 202110750189.6, filed 2 Jul. 2021. Contents of aforementioned applications are incorporated by reference in their entirety.

TECHNICAL FIELD

The present disclosure is generally related to mobile communications and, more particularly, to re-transmission cyclic redundancy check (CRC) for polar coding incremental-redundancy hybrid automatic repeat request (IR-HARQ) in mobile communications.

BACKGROUND

Unless otherwise indicated herein, approaches described in this section are not prior art to the claims listed below and are not admitted as prior art by inclusion in this section.

In mobile communications based on the $3^{rd}$ Generation Partnership Project (3GPP) standards, polar codes are used as error-correction codes on 5th Generation (5G) New Radio (NR) control channels. With polar code encoding, when K information bits are transmitted in a block of N bits, a channel is polarized into reliable and un-reliable bit-channels such that the K information bits are transmitted on the most reliable K bit-channels while the remaining N–K channels are unreliable (and hence may be set to 0). It would be desirable to apply IR-HARQ for the re-transmission of polar coding to gain capacity by relatively noiseless channel(s) and to enhance likelihood in recovery of vulnerable information bits in re-transmission. Therefore, there is a need for a solution to utilize re-transmission CRC for polar coding IR-HARQ in mobile communications.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

One objective of the present disclosure is propose schemes, concepts, designs, systems, methods and apparatus pertaining to re-transmission CRC for polar coding IR-HARQ in mobile communications. It is believed that the various schemes proposed herein may allow IR-HARQ to be applied for the re-transmission of polar coding so as to achieve more polarization to gain capacity by relatively noiseless channels and to enhance likelihood in recovery of vulnerable information bits in re-transmission.

In one aspect, a method may involve encoding a plurality of information bits using a polar code to generate a polar code block (CB). The method may also involve performing one or more transmissions of the polar CB using HARQ by: (i) performing an initial transmission of the polar CB; and (ii) performing a re-transmission of the polar CB with a re-transmission (CRC).

In another aspect, a method may involve receiving one or more transmissions of a polar CB using HARQ. The method may also involve decoding the one or more transmissions.

In still another aspect, an apparatus may include a transceiver and a processor coupled to the transceiver. The transceiver may be configured to communicate wirelessly. The processor may be configured to perform operations involving: (a) encoding a plurality of information bits using a polar code to generate a polar CB; and (b) performing, via the transceiver, one or more transmissions of the polar CB using HARQ by: (i) performing an initial transmission of the polar CB; and (ii) performing a re-transmission of the polar CB with a re-transmission CRC.

It is noteworthy that, although description provided herein may be in the context of certain radio access technologies, networks and network topologies such as 5G/New Radio (NR) mobile networking, the proposed concepts, schemes and any variation(s)/derivative(s) thereof may be implemented in, for and by other types of wireless and wired communication technologies, networks and network topologies such as, for example and without limitation, Ethernet, Evolved Packet System (EPS), Universal Terrestrial Radio Access Network (UTRAN), Evolved UTRAN (E-UTRAN), Global System for Mobile communications (GSM), General Packet Radio Service (GPRS)/Enhanced Data rates for Global Evolution (EDGE) Radio Access Network (GERAN), Long-Term Evolution (LTE), LTE-Advanced, LTE-Advanced Pro, Internet-of-Things (IoT), Industrial IoT (IIoT), Narrow Band Internet of Things (NB-IoT), and any future-developed networking technologies. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

FIG. 4 is a flowchart of an example process in accordance with an implementation of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Implementations in accordance with the present disclosure relate to various techniques, methods, schemes and/or solutions pertaining to re-transmission CRC for polar coding IR-HARQ in mobile communications. According to the present disclosure, a number of possible solutions may be implemented separately or jointly. That is, although these possible solutions may be described below separately, two or more of these possible solutions may be implemented in one combination or another.

Figure 1:
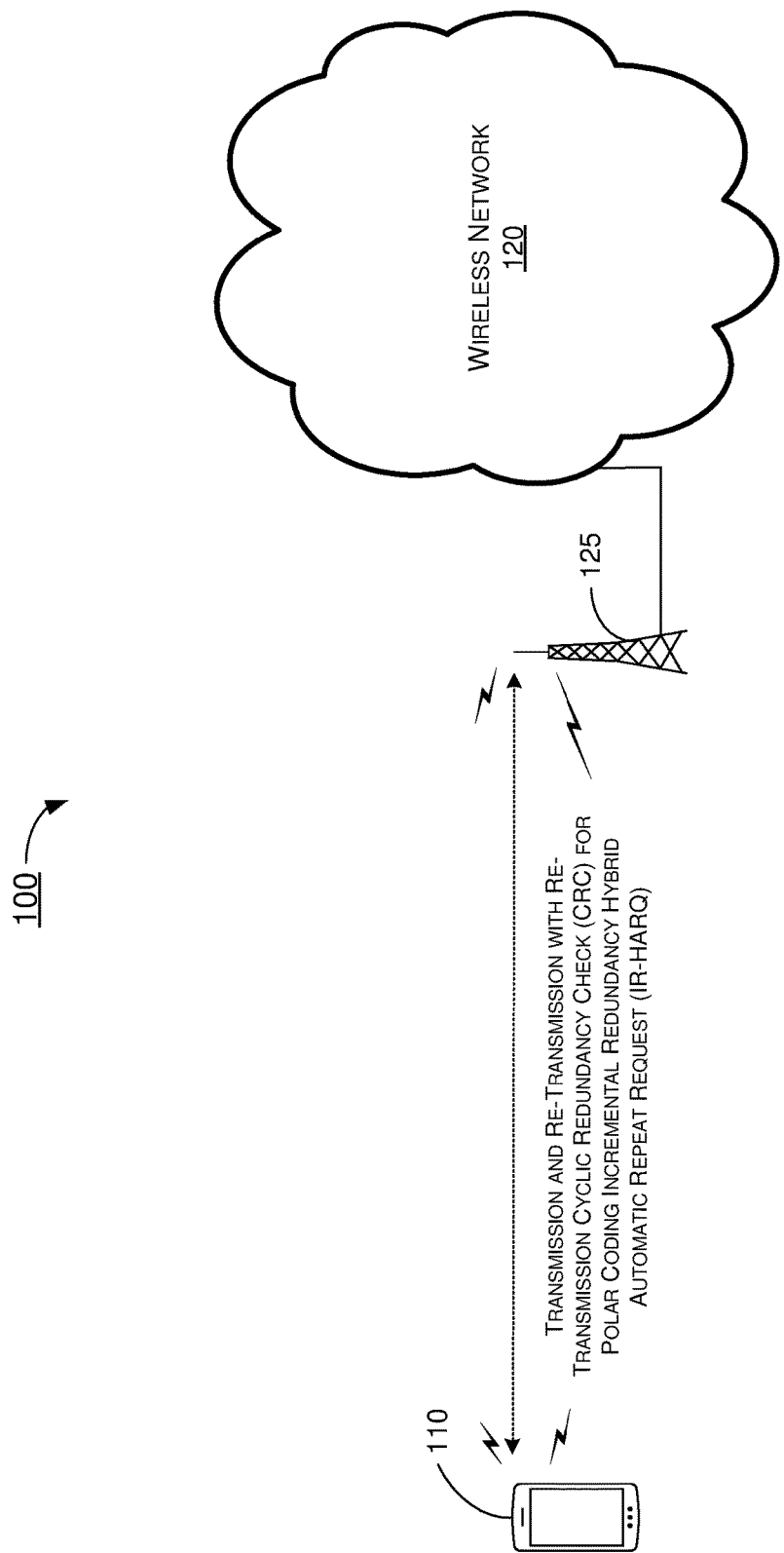
FIG. 1 is a diagram of an example network environment in which various solutions and schemes in accordance with the present disclosure may be implemented.

FIG. 1 illustrates an example network environment 100 in which various solutions and schemes in accordance with the present disclosure may be implemented. Referring to FIG. 1, network environment 100 may involve a user equipment (UE) 110 and a wireless network 120. UE 110 and network 120 may be in wireless communications via one or more network nodes (e.g., eNBs, gNBs and/or transmit/receive points (TRPs)) including a network node 125. In network environment 100, UE 110 and wireless network 120 may be configured to implement various schemes pertaining to re-transmission CRC for polar coding IR-HARQ in mobile communications in accordance with the present disclosure, as described herein.

In general, with polar codes, channel capacity gain may be achieved by polarization of channels with a Kronecker (recursive) characteristic for $N=2^n$. That is, as a result of the polarization effect, one part of the channels may become noisy or relatively noisy while another part of the channels may become noiseless or relatively noiseless. Accordingly, in encoding information bits for transmission, an encoder in UE 110 or network node 125 may freeze the noisy channels by setting bits transmitted on those noisy channels to zero while exploiting the noiseless channels for transmission of information bits. The noiseless channels may achieve channel capacity in case $N \to \infty$. Under various proposed schemes in accordance with the present disclosure, incremental redundancy structure may be applied for the re-transmission of polar coding. It is believed that, under the various proposed schemes, more polarization may result in capacity gain by relatively noiseless channels. Moreover, under the various proposed schemes, recovery of vulnerable information bits may become more likely in re-transmission.

Under a proposed scheme in accordance with the present disclosure, an initial transmission and its associated re-transmission(s) may be generated from a joint polar code with a larger size of N'. For instance, N'=2N when N is the polar code size for the initial transmission. Under the proposed scheme, a part of a plurality of information bits carried in the initial transmission in a re-transmission. For instance, one or more re-transmission information bits may be selected from the plurality of information bits based on a second polar input sequence or a lookup table. It is believed that the re-transmission CRC may allow UE 110 or network node 125 to reduce complexity in decoding a size-N' joint polar code.

Figure 2:
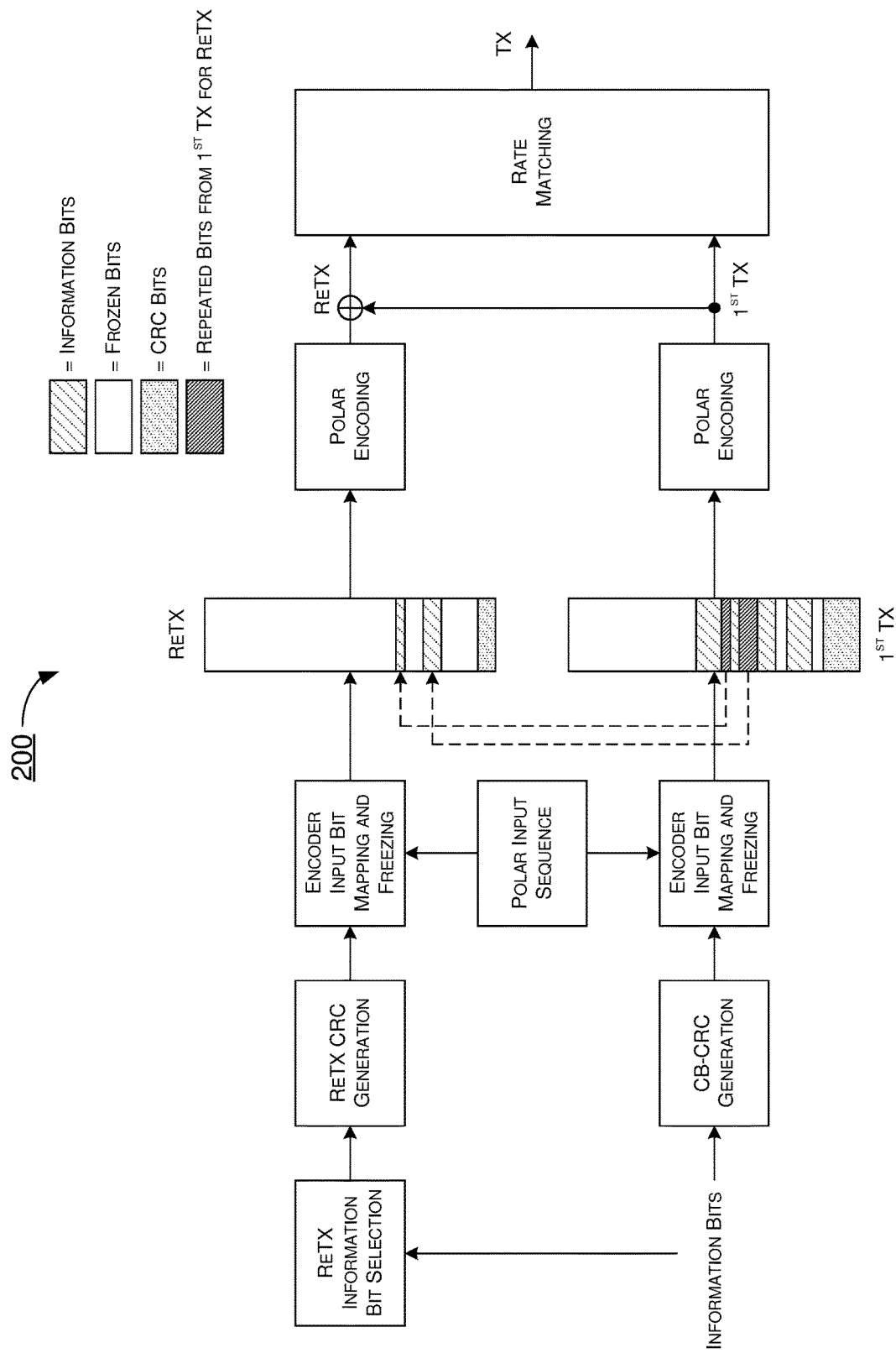
FIG. 2 is a diagram of an example design in an implementation under a proposed scheme in accordance with the present disclosure.

FIG. 2 illustrates an example design 200 in an implementation under a proposed scheme in accordance with the present disclosure. In design 200, for an initial transmission (denoted as "$1^{st}$ TX" in FIG. 2), a code block cyclic redundancy check (CB CRC) may be generated with a plurality of information bits to be transmitted as input. For instance, the CB CRC may be generated as an NR physical downlink shared channel (PDSCH) CB CRC. Then, encoder input bit mapping and freezing may be performed based on the CB CRC and a polar input sequence of a size N to generate a size-N polar sub-code carrying the information bits, which is shown in the lower portion of FIG. 2. The encoder input bit mapping and freezing functional block may receive an input from the polar input sequence functional block that indicates the size of a polar CB to be generated as N bits (e.g., for the lower polar sub-code). The size-N polar sub-code carrying the information bits may then be processed by polar encoding to generate a size-N initial polar code to be rate-matched and transmitted.

In design 200, for re-transmission, one or more unreliable bits for the initial transmission may be selected from the plurality of information bits as one or more re-transmission information bits. For instance, selection of the one or more re-transmission information bits may be based on a second polar input sequence or a lookup table as a function of K, N and/or E. The one or more re-transmission information bits may be utilized in generating a re-transmission CRC (ReTX CRC). Then, encoder input bit mapping and freezing may be performed based on the ReTX CRC and the same polar input sequence (used for the initial transmission) to generate a size-N polar sub-code carrying the one or more re-transmission information bits for IR-HARQ, which is shown in the lower portion of FIG. 2. The encoder input bit mapping and freezing functional block may receive an input from the polar input sequence functional block that indicates the size of a polar CB to be generated as N bits (e.g., for the upper polar sub-code). The size-N polar sub-code carrying the one or more re-transmission information bits may then be processed by polar encoding to generate a size-2N re-transmission polar code to be rate-matched and transmitted. In design 200, the output of the lower polar encoding functional block and the output of the upper polar encoding functional block may be XOR'd so that one size-N polar CB is provided as input to the rate-matching function block. For reduction in overhead and decoding complexity, the re-transmission may include ReTX CRC, which has a size smaller than (e.g., fewer bits) than that of the CB CRC.

Under a proposed scheme in accordance with the present disclosure, the ReTX CRC may be added when the size or length of the polar mother code of the initial transmission equals a predetermined value such as, for example, 4096 (e.g., N=4096). As an example, when the polar mother code length is equal to the predetermined value (e.g., N=4096), a length or size of the ReTX CRC may be set to a corresponding value (e.g., 8). Otherwise, when the polar mother code length is not equal to the predetermined value (e.g., N #4096), the ReTX CRC may not be utilized or the size thereof may be set to 0.

Accordingly, under various proposed schemes in accordance with the present disclosure, ReTX CRC may be utilized at least when polar IR-HARQ is applied in cases of a large code block size (e.g., N=4096). Advantageously, ReTX CRC may allow UE 110 and network node 125 to reduce complexity in decoding a size-N joint IR polar code and with comparable performance with using a size-2N polar code. Moreover, under various proposed schemes in accordance with the present disclosure, an original size-N decoder may be used (or otherwise re-used) twice for decoding the size-2N polar code after IR-HARQ combination.

Illustrative Implementations

Figure 3:
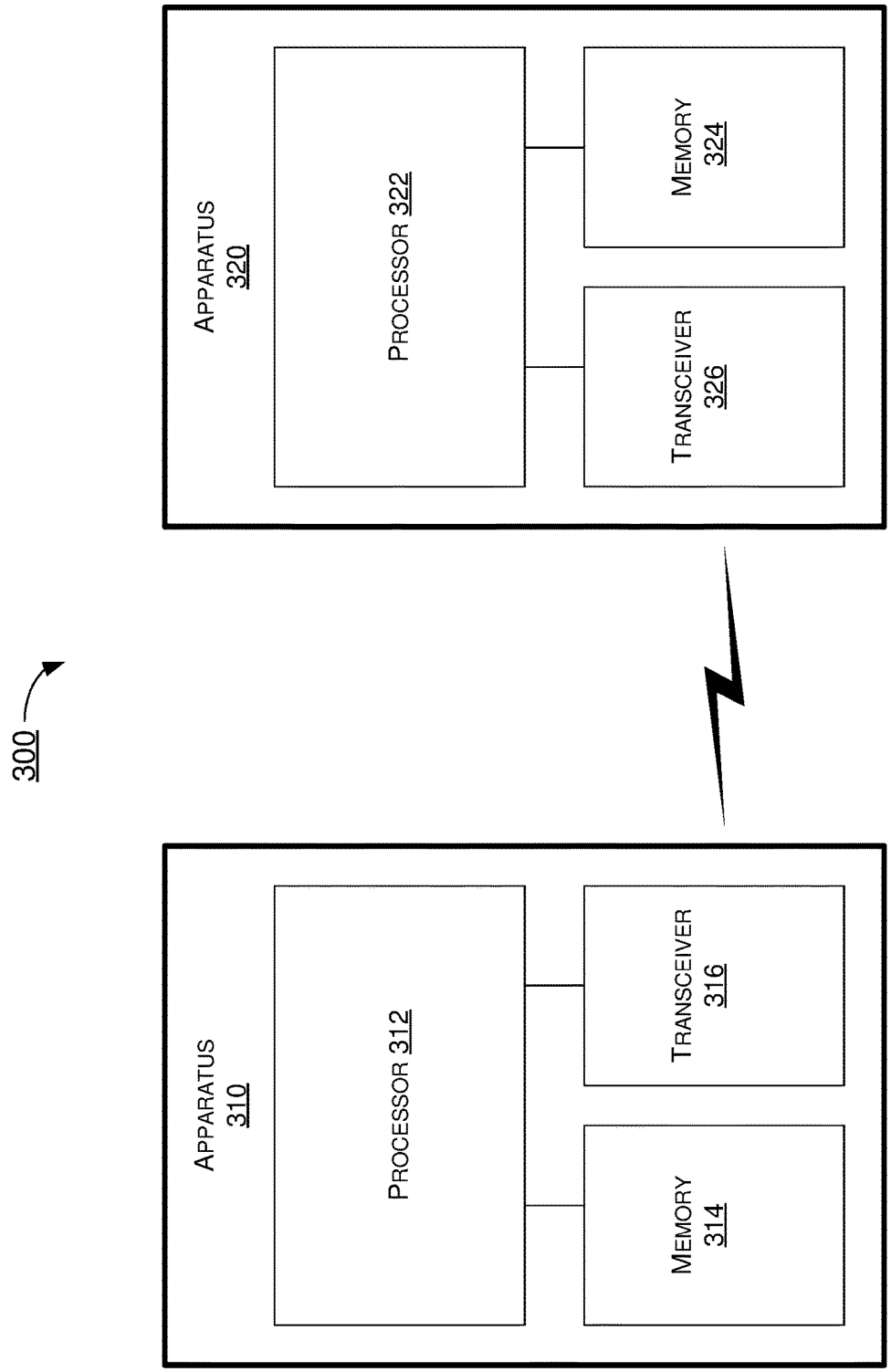
FIG. 3 is a block diagram of an example communication system in accordance with an implementation of the present disclosure.

FIG. 3 illustrates an example communication system 300 having at least an example apparatus 310 and an example apparatus 320 in accordance with an implementation of the present disclosure. Each of apparatus 310 and apparatus 320 may perform various functions to implement schemes, techniques, processes and methods described herein pertaining to re-transmission CRC for polar coding IR-HARQ in mobile communications, including the various schemes described above with respect to various proposed designs, concepts, schemes, systems and methods described above, including network environment 100, as well as processes described below.

Each of apparatus 310 and apparatus 320 may be a part of an electronic apparatus, which may be a network apparatus or a UE (e.g., UE 110), such as a portable or mobile apparatus, a wearable apparatus, a vehicular device or a vehicle, a wireless communication apparatus or a computing apparatus. For instance, each of apparatus 310 and apparatus 320 may be implemented in a smartphone, a smart watch, a personal digital assistant, an electronic control unit (ECU) in a vehicle, a digital camera, or a computing equipment such as a tablet computer, a laptop computer or a notebook computer. Each of apparatus 310 and apparatus 320 may also be a part of a machine type apparatus, which may be an IoT apparatus such as an immobile or a stationary apparatus, a home apparatus, a roadside unit (RSU), a wire communication apparatus or a computing apparatus. For instance, each of apparatus 310 and apparatus 320 may be implemented in a smart thermostat, a smart fridge, a smart door lock, a wireless speaker or a home control center. When implemented in or as a network apparatus, apparatus 310 and/or apparatus 320 may be implemented in an eNodeB in an LTE, LTE-Advanced or LTE-Advanced Pro network or in a gNB or TRP in a 5G network, an NR network or an IoT network.

In some implementations, each of apparatus 310 and apparatus 320 may be implemented in the form of one or more integrated-circuit (IC) chips such as, for example and without limitation, one or more single-core processors, one or more multi-core processors, one or more complex-instruction-set-computing (CISC) processors, or one or more reduced-instruction-set-computing (RISC) processors. In the various schemes described above, each of apparatus 310 and apparatus 320 may be implemented in or as a network apparatus or a UE. Each of apparatus 310 and apparatus 320 may include at least some of those components shown in FIG. 3 such as a processor 312 and a processor 322, respectively, for example. Each of apparatus 310 and apparatus 320 may further include one or more other components not pertinent to the proposed scheme of the present disclosure (e.g., internal power supply, display device and/or user interface device), and, thus, such component(s) of apparatus 310 and apparatus 320 are neither shown in FIG. 3 nor described below in the interest of simplicity and brevity.

In one aspect, each of processor 312 and processor 322 may be implemented in the form of one or more single-core processors, one or more multi-core processors, or one or more CISC or RISC processors. That is, even though a singular term "a processor" is used herein to refer to processor 312 and processor 322, each of processor 312 and processor 322 may include multiple processors in some implementations and a single processor in other implementations in accordance with the present disclosure. In another aspect, each of processor 312 and processor 322 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, each of processor 312 and processor 322 is a special-purpose machine specifically designed, arranged and configured to perform specific tasks including those pertaining to re-transmission CRC for polar coding IR-HARQ in mobile communications in accordance with various implementations of the present disclosure.

In some implementations, apparatus 310 may also include a transceiver 316 coupled to processor 312. Transceiver 316 may be capable of wirelessly transmitting and receiving data. In some implementations, transceiver 316 may be capable of wirelessly communicating with different types of wireless networks of different radio access technologies (RATs). In some implementations, transceiver 316 may be equipped with a plurality of antenna ports (not shown) such as, for example, four antenna ports. That is, transceiver 316 may be equipped with multiple transmit antennas and multiple receive antennas for multiple-input multiple-output (MIMO) wireless communications. In some implementations, apparatus 320 may also include a transceiver 326 coupled to processor 322. Transceiver 326 may include a transceiver capable of wirelessly transmitting and receiving data. In some implementations, transceiver 326 may be capable of wirelessly communicating with different types of UEs/wireless networks of different RATs. In some implementations, transceiver 326 may be equipped with a plurality of antenna ports (not shown) such as, for example, four antenna ports. That is, transceiver 326 may be equipped with multiple transmit antennas and multiple receive antennas for MIMO wireless communications.

In some implementations, apparatus 310 may further include a memory 314 coupled to processor 312 and capable of being accessed by processor 312 and storing data therein. In some implementations, apparatus 320 may further include a memory 324 coupled to processor 322 and capable of being accessed by processor 322 and storing data therein. Each of memory 314 and memory 324 may include a type of random-access memory (RAM) such as dynamic RAM (DRAM), static RAM (SRAM), thyristor RAM (T-RAM) and/or zero-capacitor RAM (Z-RAM). Alternatively, or additionally, each of memory 314 and memory 324 may include a type of read-only memory (ROM) such as mask ROM, programmable ROM (PROM), erasable programmable ROM (EPROM) and/or electrically erasable programmable ROM (EEPROM). Alternatively, or additionally, each of memory 314 and memory 324 may include a type of non-volatile random-access memory (NVRAM) such as flash memory, solid-state memory, ferroelectric RAM (Fe-RAM), magnetoresistive RAM (MRAM) and/or phase-change memory. Alternatively, or additionally, each of memory 314 and memory 324 may include a UICC.

Each of apparatus 310 and apparatus 320 may be a communication entity capable of communicating with each other using various proposed schemes in accordance with the present disclosure. For illustrative purposes and without limitation, a description of capabilities of apparatus 310, as a UE (e.g., UE 110), and apparatus 320, as a network node (e.g., network node 35) of a wireless network (e.g., wireless network 30), is provided below.

Under a proposed scheme in accordance with the present disclosure with respect to re-transmission CRC for polar coding IR-HARQ in mobile communications, processor 312 of apparatus 310, implemented in or as UE 110, may encode a plurality of information bits using a polar code to generate a polar CB. Moreover, processor 312 may perform, via transceiver 316, one or more transmissions of the polar CB using HARQ to apparatus 320 implemented in or as network node 125 by performing certain operations. For instance, processor 312 may perform an initial transmission of the polar CB. Furthermore, processor 312 may perform a re-transmission of the polar CB with a ReTX CRC.

In some implementations, the re-transmission of the polar CB may be performed with the ReTX CRC in an event that polar IR-HARQ is applied in the re-transmission.

In some implementations, the re-transmission of the polar CB may be performed with the ReTX CRC in an event that polar IR-HARQ is applied in re-transmitting the polar CB with a size greater than or equal to a predefined size. For instance, the re-transmission of the polar CB may be performed with the ReTX CRC in an event that polar IR-HARQ is applied in re-transmitting the polar CB with a size of 4096 bits. In such cases, a size of the ReTX CRC may be 8 bits.

In some implementations, in performing the initial transmission of the polar CB, processor 312 may perform the initial transmission of the polar CB with a CB CRC. In such cases, a size of the ReTX CRC may be smaller than a size of the CB CRC.

In some implementations, in performing the one or more transmissions of the polar CB, processor 312 may utilize a joint polar code of a size N to generate the polar CB with a CB CRC having the size N for the initial transmission and to generate the polar CB with the ReTX CRC having a size 2N for the re-transmission in which an upper N bits of the size-2N polar CB is transmitted.

In some implementations, in performing the re-transmission of the polar CB with the ReTX CRC, processor 312 may perform certain operations. For instance, processor 312 may select one or more bits from the plurality of information bits to be re-transmitted. Moreover, processor 312 may generate the ReTX CRC based on the selected one or more bits. Furthermore, processor 312 may perform encoder input bit mapping and freezing based on the selected one or more bits, the ReTX CRC, and a polar input sequence. In such cases, the polar input sequence may also be utilized in generating the polar CB with a CB CRC for the initial transmission.

Under another proposed scheme in accordance with the present disclosure with respect to re-transmission CRC for polar coding IR-HARQ in mobile communications, processor 312 of apparatus 310, implemented in or as UE 110, may receive, via transceiver 316, one or more transmissions of a polar CB using HARQ from apparatus 320 implemented in or as network node 125. Additionally, processor 312 may decode the one or more transmissions by performing certain operations. In an event that the one or more transmissions include an initial transmission with no re-transmission, processor 312 may decode the initial transmission with a size-N decoder (e.g., by using a successive cancellation list (SCL) decoder). Alternatively, in an event that the one or more transmissions include the initial transmission and at least a re-transmission, processor 312 may perform the following: (i) decoding from a least index of a re-transmission CB (e.g., from top to bottom of the re-transmission CB) with the size-N decoder; (ii) determining one or more candidates (or lists) to preserve the one or more candidates which pass a ReTX CRC; and (iii) decoding an original polar CB in the initial transmission from top to bottom with the size-N decoder.

In some implementations, the re-transmission of the polar CB may be received with the ReTX CRC in an event that polar IR-HARQ is applied in the re-transmission.

In some implementations, the re-transmission of the polar CB may be received with the ReTX CRC in an event that polar IR-HARQ is applied in re-transmitting the polar CB with a size greater than or equal to a predefined size. For instance, the re-transmission of the polar CB may be received with the ReTX CRC in an event that polar IR-HARQ is applied in re-transmitting the polar CB with a size of 4096 bits. In such cases, a size of the ReTX CRC may be 8 bits.

In some implementations, the initial transmission of the polar CB may be received with a CB CRC. In such cases, a size of the ReTX CRC may be smaller than a size of the CB CRC.

In some implementations, in receiving the one or more transmissions of the polar CB, processor 312 may utilize a joint polar code of a size N to decode the initial transmission of the polar CB with a CB CRC having the size N and to decode the re-transmission of the polar CB with the ReTX CRC having a size 2N.

Illustrative Processes

FIG. 4 illustrates an example process 400 in accordance with an implementation of the present disclosure. Process 400 may represent an aspect of implementing various proposed designs, concepts, schemes, systems and methods described above, whether partially or entirely, including those described above. More specifically, process 400 may represent an aspect of the proposed concepts and schemes pertaining to re-transmission CRC for polar coding IR-HARQ in mobile communications. Process 400 may include one or more operations, actions, or functions as illustrated by one or more of blocks 410 and 420 as well as sub-blocks 422 and 424. Although illustrated as discrete blocks, various blocks of process 400 may be divided into additional blocks, combined into fewer blocks, or eliminated, depending on the desired implementation. Moreover, the blocks/sub-blocks of process 400 may be executed in the order shown in FIG. 4 or, alternatively in a different order. Furthermore, one or more of the blocks/sub-blocks of process 400 may be executed iteratively. Process 400 may be implemented by or in apparatus 310 and apparatus 320 as well as any variations thereof. Solely for illustrative purposes and without limiting the scope, process 400 is described below in the context of apparatus 310 as a UE (e.g., UE 110) and apparatus 320 as a communication entity such as a network node or base station (e.g., network node 125) of a wireless network (e.g., wireless network 120). Process 400 may begin at block 410.

At 410, process 400 may involve processor 312 of apparatus 310, implemented in or as UE 110, encoding a plurality of information bits using a polar code to generate a polar CB. Process 400 may proceed from 410 to 420.

At 420, process 400 may involve processor 312 performing, via transceiver 316, one or more transmissions of the polar CB using HARQ by performing operations represented by 422 and 424.

At 422, process 400 may involve processor 312 performing an initial transmission of the polar CB. Process 400 may proceed from 422 to 424.

At 424, process 400 may involve processor 312 performing a re-transmission of the polar CB with a ReTX CRC.

In some implementations, the re-transmission of the polar CB may be performed with the ReTX CRC in an event that polar IR-HARQ is applied in the re-transmission.

In some implementations, the re-transmission of the polar CB may be performed with the ReTX CRC in an event that polar IR-HARQ is applied in re-transmitting the polar CB with a size greater than or equal to a predefined size. For instance, the re-transmission of the polar CB may be performed with the ReTX CRC in an event that polar IR-HARQ is applied in re-transmitting the polar CB with a size of 4096 bits. In such cases, a size of the ReTX CRC may be 8 bits.

In some implementations, in performing the initial transmission of the polar CB, process 400 may involve processor 312 performing the initial transmission of the polar CB with a CB CRC. In such cases, a size of the ReTX CRC may be smaller than a size of the CB CRC.

In some implementations, in performing the one or more transmissions of the polar CB, process 400 may involve processor 312 utilizing a joint polar code of a size N to generate the polar CB with a CB CRC having the size N for the initial transmission and to generate the polar CB with the ReTX CRC having a size 2N for the re-transmission in which an upper N bits of the size-2N polar CB is transmitted.

In some implementations, in performing the re-transmission of the polar CB with the ReTX CRC, process 400 may involve processor 312 performing certain operations. For instance, process 400 may involve processor 312 selecting one or more bits from the plurality of information bits to be re-transmitted. Moreover, process 400 may involve processor 312 generating the ReTX CRC based on the selected one or more bits. Furthermore, process 400 may involve processor 312 performing encoder input bit mapping and freezing based on the selected one or more bits, the ReTX CRC, and a polar input sequence. In such cases, the polar input sequence may also be utilized in generating the polar CB with a CB CRC for the initial transmission.

Figure 5:
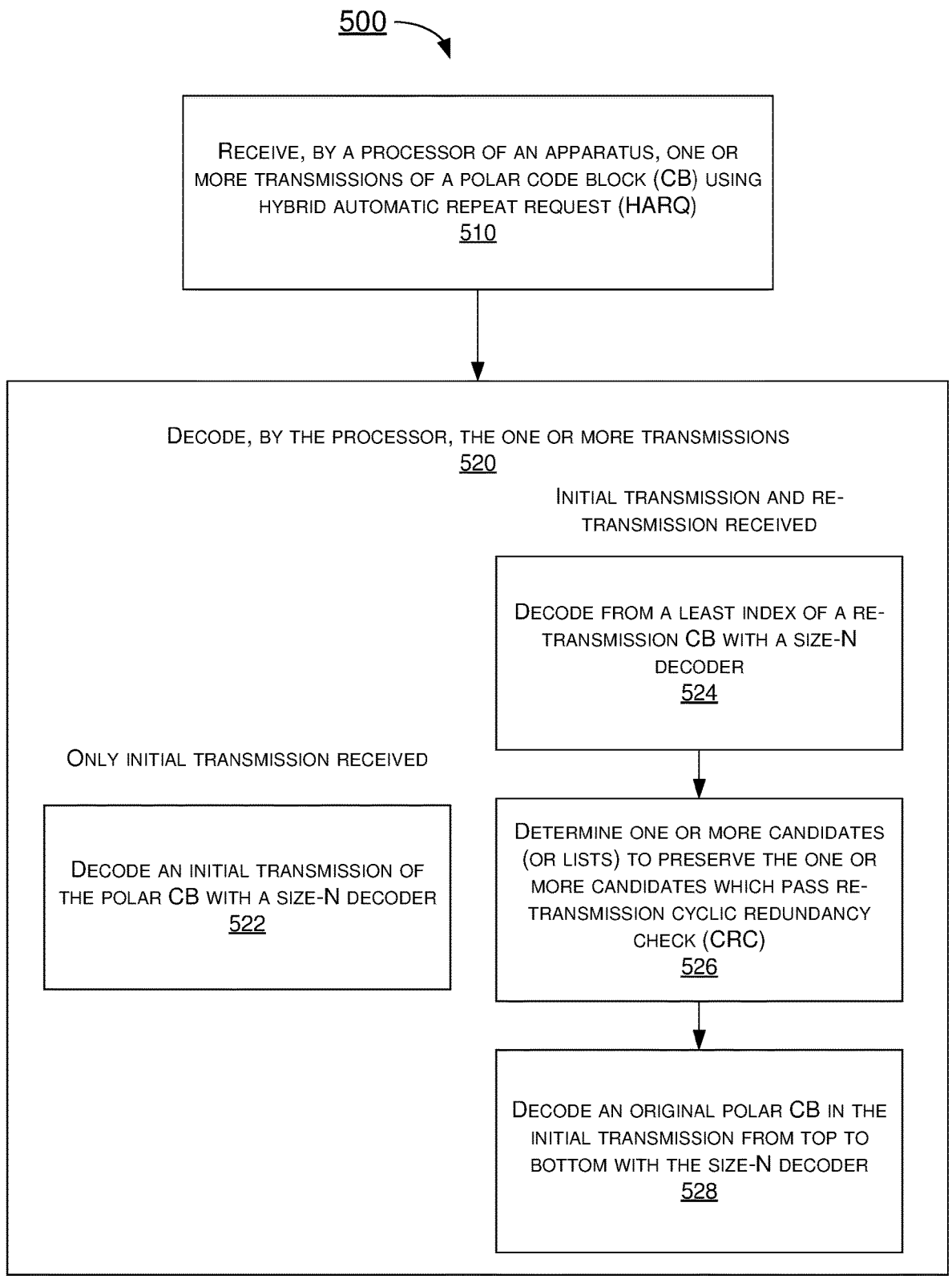
FIG. 5 is a flowchart of an example process in accordance with an implementation of the present disclosure.

FIG. 5 illustrates an example process 500 in accordance with an implementation of the present disclosure. Process 500 may represent an aspect of implementing various proposed designs, concepts, schemes, systems and methods described above, whether partially or entirely, including those described above. More specifically, process 500 may represent an aspect of the proposed concepts and schemes pertaining to re-transmission CRC for polar coding IR-HARQ in mobile communications. Process 500 may include one or more operations, actions, or functions as illustrated by one or more of blocks 510 and 520 as well as sub-blocks 522, 524, 526 and 528. Although illustrated as discrete blocks, various blocks of process 500 may be divided into additional blocks, combined into fewer blocks, or eliminated, depending on the desired implementation. Moreover, the blocks/sub-blocks of process 500 may be executed in the order shown in FIG. 5 or, alternatively in a different order. Furthermore, one or more of the blocks/sub-blocks of process 500 may be executed iteratively. Process 500 may be implemented by or in apparatus 310 and apparatus 320 as well as any variations thereof. Solely for illustrative purposes and without limiting the scope, process 500 is described below in the context of apparatus 310 as a UE (e.g., UE 110) and apparatus 320 as a communication entity such as a network node or base station (e.g., network node 125) of a wireless network (e.g., wireless network 120). Process 500 may begin at block 510.

At 510, process 500 may involve processor 312 of apparatus 310, implemented in or as UE 110, receiving, via transceiver 316, one or more transmissions of a polar CB using HARQ. Process 500 may proceed from 510 to 520.

At 520, process 500 may involve processor 312 decoding the one or more transmissions by performing operations represented by 522, 524, 526 and 528, depending on whether the one or more transmissions include at least a re-transmission besides an initial transmission.

At 522, in an event that the one or more transmissions include the initial transmission with no re-transmission, process 500 may involve processor 312 decoding the initial transmission of the polar CB with a size-N decoder (e.g., by using a successive cancellation list (SCL) decoder).

At 524, in an event that the one or more transmissions include the initial transmission and at least a re-transmission, process 500 may involve processor 312 decoding from a least index of a re-transmission CB (e.g., from top to bottom of the re-transmission CB) with the size-N decoder. Process 500 may proceed from 524 to 526.

At 526, process 500 may involve processor 312 determining one or more candidates (or lists) to preserve the one or more candidates which pass a ReTX CRC. Process 500 may proceed from 526 to 528.

At 528, process 500 may involve processor 312 decoding an original polar CB in the initial transmission from top to bottom with the size-N decoder.

In some implementations, the re-transmission of the polar CB may be received with the ReTX CRC in an event that polar IR-HARQ is applied in the re-transmission.

In some implementations, the re-transmission of the polar CB may be received with the ReTX CRC in an event that polar IR-HARQ is applied in re-transmitting the polar CB with a size greater than or equal to a predefined size. For instance, the re-transmission of the polar CB may be received with the ReTX CRC in an event that polar IR-HARQ is applied in re-transmitting the polar CB with a size of 4096 bits. In such cases, a size of the ReTX CRC may be 8 bits.

In some implementations, the initial transmission of the polar CB may be received with a CB CRC. In such cases, a size of the ReTX CRC may be smaller than a size of the CB CRC.

In some implementations, in receiving the one or more transmissions of the polar CB, process 500 may involve processor 312 utilizing a joint polar code of a size N to decode the initial transmission of the polar CB with a CB CRC having the size N and to decode the re-transmission of the polar CB with the ReTX CRC having a size 2N.

ADDITIONAL NOTES

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
    encoding, by a processor of an apparatus, a plurality of information bits using a polar code to generate a polar code block (CB); and
    performing, by the processor, one or more transmissions of the polar CB using hybrid automatic repeat request (HARQ) by:
        performing an initial transmission of the polar CB; and
        performing a re-transmission of the polar CB with a re-transmission cyclic redundancy check (ReTX CRC),
    wherein the performing of the initial transmission of the polar CB comprises performing the initial transmission of the polar CB with a code block cyclic redundancy check (CB CRC), and
    wherein a size of the ReTX CRC is smaller than a size of the CB CRC.

2. The method of claim 1, wherein the re-transmission of the polar CB is performed with the ReTX CRC in an event that polar incremental redundancy HARQ (IR-HARQ) is applied in the re-transmission.

3. The method of claim 1, wherein the re-transmission of the polar CB is performed with the ReTX CRC in an event that polar incremental redundancy HARQ (IR-HARQ) is applied in re-transmitting the polar CB with a size greater than or equal to a predefined size.

4. The method of claim 1, wherein the re-transmission of the polar CB is performed with the ReTX CRC in an event that polar incremental redundancy HARQ (IR-HARQ) is applied in re-transmitting the polar CB with a size of 4096 bits, and wherein a size of the ReTX CRC is 8 bits.

5. The method of claim 1, wherein the performing of the one or more transmissions of the polar CB comprises utilizing a joint polar code of a size N to generate the polar CB with a code block cyclic redundancy check (CB CRC) having the size N for the initial transmission and to generate the polar CB with the ReTX CRC having a size 2N for the re-transmission in which an upper N bits of the size-2N polar CB is transmitted.

6. The method of claim 1, wherein the performing of the re-transmission of the polar CB with the ReTX CRC comprises:
    selecting one or more bits from the plurality of information bits to be re-transmitted;
    generating the ReTX CRC based on the selected one or more bits; and
    performing encoder input bit mapping and freezing based on the selected one or more bits, the ReTX CRC, and a polar input sequence,
    wherein the polar input sequence is also used in generating the polar CB with a code block cyclic redundancy check (CB CRC) for the initial transmission.

7. An apparatus, comprising:
    a transceiver configured to communicate wirelessly; and
    a processor coupled to the transceiver and configured to perform operations comprising:
        encoding a plurality of information bits using a polar code to generate a polar code block (CB); and
        performing, via the transceiver, one or more transmissions of the polar CB using hybrid automatic repeat request (HARQ) by:
            performing an initial transmission of the polar CB; and performing a re-transmission of the polar CB with a re-transmission cyclic redundancy check (ReTX CRC), wherein, in performing the initial transmission of the polar CB, the processor is configured to perform the initial transmission of the polar CB with a code block cyclic redundancy check (CB CRC), and wherein a size of the ReTX CRC is smaller than a size of the CB CRC.

8. The apparatus of claim 7, wherein the re-transmission is performed with the ReTX CRC in an event that polar incremental redundancy HARQ (IR-HARQ) is applied in the re-transmission.

9. The apparatus of claim 7, wherein the re-transmission is performed with the ReTX CRC in an event that polar incremental redundancy HARQ (IR-HARQ) is applied in re-transmitting the polar CB with a size greater than or equal to a predefined size.

10. The apparatus of claim 7, wherein the re-transmission is performed with the ReTX CRC in an event that polar incremental redundancy HARQ (IR-HARQ) is applied in re-transmitting the polar CB with a size of 4096 bits, and wherein a size of the ReTX CRC is 8 bits.

11. The apparatus of claim 7, wherein, in performing the one or more transmissions of the polar CB, the processor is configured to utilize a joint polar code of a size N to generate the polar CB with a code block cyclic redundancy check (CB CRC) having the size N for the initial transmission and to generate the polar CB with the ReTX CRC having a size 2N for the re-transmission in which an upper N bits of the size-2N polar CB is transmitted.

12. The apparatus of claim 7, wherein, in performing the re-transmission of the polar CB with the ReTX CRC, the processor is configured to perform operations comprising:

selecting one or more bits from the plurality of information bits to be re-transmitted;

generating the ReTX CRC based on the selected one or more bits; and performing encoder input bit mapping and freezing based on the selected one or more bits, the ReTX CRC, and a polar input sequence, wherein the polar input sequence is also used in generating the polar CB with a code block cyclic redundancy check (CB CRC) for the initial transmission.

\* \* \* \* \*